United States Patent [19]

Rafiee

[11] Patent Number: 5,077,450
[45] Date of Patent: Dec. 31, 1991

[54] HIGH-VOLTAGE ELECTRICAL TEST TERMINAL

[76] Inventor: Masoud Rafiee, 2470 Stoneleigh Ct., Dublin, Ohio 43017

[21] Appl. No.: 597,368

[22] Filed: Oct. 15, 1990

[51] Int. Cl.$^5$ .......................................... H01B 17/00
[52] U.S. Cl. ................................ 174/145; 174/152 R; 174/169; 324/726; 439/797; 439/894; 439/921
[58] Field of Search ................... 174/145, 152 R, 169; 324/547, 551, 726; 336/107; 439/225, 796, 797, 894, 908, 921

[56] References Cited

U.S. PATENT DOCUMENTS 1,979,099 10/1934 Cornell et al. .................. 174/145
3,612,750 10/1971 Monico et al. .................. 174/145
3,813,504 5/1974 Anderson ...................... 200/48 R Primary Examiner—Leo P. Picard
Assistant Examiner—Trinidad Korka
Attorney, Agent, or Firm—Michael Sand Co.

[57] ABSTRACT

A high-voltage test terminal for interconnection between high-voltage power lines and the bushing stud member of a transformer or reactor. An insulator component of the terminal is placed in compression rather than tension, the terminal having a substantially reduced moment arm to withstand angular forces which are created upon interconnection between the power lines and the stud member. Metallic end fittings for the insulator serve to maintain the insulator in permanent compression and provide ready disconnection of the bus bars of the terminal for determination of induced electrical currents such as by Doble testing. The insulator is mounted horizontally between the end fittings and between the power lines in substantially parallel and horizontal alignment therewith, and eliminates the torsional stresses which have been generated previously with upright post-type insulators. The terminal utilizes a pair of horizontal bus bars which may be readily disconnected by swinging movement away from one end fitting for testing and efficient re-connection to rejoin the electrically conductive end fittings of the terminal.

20 Claims, 4 Drawing Sheets

HIGH-VOLTAGE ELECTRICAL TEST TERMINAL

BACKGROUND OF THE INVENTION

1. Technical Field

The present invention relates to test terminals for use in electrical primary power distribution circuits. In particular, the invention relates to test terminals which are placed directly in electrical series with power lines which connect to high-voltage transformers or reactors at their bushing stud members. The test terminal is placed directly in mechanical as well as electrical series with power lines leading to and from transformers and reactors at their inlet and outlet bushing stud members. The terminals carry the full current in the lines when they are closed and facilitate electrical isolation of the transformer or reactor when open to test induced electrical currents such as by Doble testing. The terminals maintain structural integrity in the lines at a level sufficiently strong to physically support the lines under adverse weather conditions which may mechanically overload the lines and terminals when connected to the bushing stud members. The present invention further relates to maintaining the insulator portion of the terminal in compression rather than tension and substantially shortens the moment arm of the terminal to withstand severe mechanical as well as high-voltage electrical loading.

2. Background Information

The most common types of test terminals for electrical power distribution systems, for interconnection to transformers and reactors having bushing studs projecting upwardly therefrom, have employed vertical post-type insulators which are terminated by end fittings and have vertical bus bars or connectors extending vertically between the fittings. A common type of such terminal is the so-called Lapp terminal having a vertical post-type ceramic insulator connected to upper and lower metal fittings such as by high temperature cement. It is most common for the end fittings to be cylindrical in shape with the insulator also being cylindrical. A pair of heavy electrical cables is connected directly to the upper fitting in vertical alignment with or at a right angle to the stud and the lower fitting is connected to the upwardly-projecting bushing stud. In such arrangement the vertical insulator is frequently placed in tension with the bushing stud carrying the entire mechanical load of the terminal and interconnected power lines. When the lines become mechanically overloaded such as by coatings of ice and high winds, the terminal insulator component is severely stressed which can cause terminal or stud breakage resulting in power outages which are difficult and time-consuming to repair. It is not uncommon for the transformer bushing stud to be bent out of vertical alignment with the transformer body which can adversely affect transformer performance or cause its failure.

It is well known in the art that continuance of positive angular orientation between the mounting surfaces of the insulator end fittings and the mating surfaces of the mounting hardware to be joined must be established and that positive mechanical and electrical connection must be maintained. When the interconnected power lines are unduly stressed, the lengthy vertical moment arm of the Lapp terminal which is normally mounted at a substantially right angle to the incoming power lines places severe torsional stress as well as tensile stress on the insulator and its interconnecting surfaces. In some cases the lengthy post-type insulator of the Lapp terminal may slip out of the U-bolt type fasteners employed to retain the insulator ends causing electrical malfunction. Also, in some cases, the insulator requires a metallic supporting ring around a medial body portion for increased mechanical strengthening of the ceramic insulator. In addition, the Lapp terminal employs a pair of parallel upright bus bars connected to the upper and lower fittings of the terminal bars which are rigidly bolted to such fittings and are not capable of ready disconnect for testing of induced electrical current. One of the most severe problems with the Lapp terminal is the high vertical moment arm which places the insulator in tension when supporting the interconnecting ends of the power lines, normally two of which are mounted in parallel. Where the post-type insulator of the Lapp terminal is supported at its ends by U-shaped bolts or retention members, the insulator member may be subject to breakage such as wherever the power lines and supporting terminal are severely stressed when covered with heavy coatings of ice or are whipped by high winds, for example.

While the common types of test terminals utilized in the industry have had suitable electrical capability for their intended interconnection purposes, many such terminals have not provided sufficient mechanical capability even though they have been constructed from heavy components which are physically similar to the Lapp terminal. Problems encountered of applying additional cantilevered force on the high-voltage equipment, and especially torsional forces exerted on the ceramic insulator component, have been a source of malfunction in high-voltage lines such as those delivering 345 kilovolts and above. Increased maintenance of such lines due to their terminal connection has necessitated the advent of this invention.

SUMMARY OF THE INVENTION

It is an object of this invention to provide a high-voltage electrical test terminal for interconnection to the bushing stud member of a transformer or reactor, the insulator component of such terminal being placed in compression rather than tension, the terminal having a substantially reduced moment arm to withstand angular forces which are created upon interconnection with the ends of high-voltage power lines. The metallic end fittings for the insulator serve to maintain the insulator in permanent compression and provide ready disconnection of the terminal for determination of induced electrical currents such as by Doble testing. The terminal has a substantially lesser moment arm to withstand angular forces generated between interconnection of horizontal power lines and the upwardly-projecting bushing stud of a transformer or reactor. The insulator component is mounted horizontally between the power lines in substantially parallel and horizontal alignment with such lines and eliminates the torsional stresses which have been generated previously with upright post-type insulators.

Another object of this invention is to provide an improved high-voltage electrical terminal wherein the insulator component is maintained in compression and the terminal may be readily disconnected for various types of testing, the terminal preventing torsional and tensile stresses between the insulator and metallic end fittings even when substantially increased mechanical loads are placed on the terminal and connecting power lines.

Another object of this invention is to provide a high-voltage test terminal for connection to an individual transformer or reactor bushing stud of a pair of relatively heavy electrical cables capable of carrying electrical current for voltages of 345 kilovolts and above. The terminal comprises an upright base plate having an aperture and clamping means for connection to the individual bushing stud member of a transformer or reactor. A cable-supporting plate having a pair of horizontal apertures and clamping means is utilized for retaining a pair of electrical cables at their ends in horizontal relation, normally at right angles to the transformer bushing stud. A ceramic or porcelain insulator is mounted in horizontal relation between the base plate and cable-supporting plate, the insulator end fittings being connected by a pair of bus bars extending parallel to each other above the insulator, the bars electrically connecting the base and cable-supporting plates which constitute insulator end fittings. The pair of bus bars has a plurality of bolt holes therein which are interconnected to slots in the bars for ready swingable movement of the bars away from one of the plates to electrically disconnect the end fittings for various electrical testing procedures. The bus bars may be swung away from one of the fittings for electrical disconnect expediting such testing with much greater efficiency in disconnect and reconnect operations.

BRIEF DESCRIPTION OF THE DRAWINGS

A preferred embodiment of the invention illustrative of the best mode in which applicant has contemplated applying the principles, is set forth in the following description and is shown in the drawings, and is particularly and distinctly pointed out and set forth in the appended claims.

DESCRIPTION OF THE PREFERRED EMBODIMENTS

Figure 1:
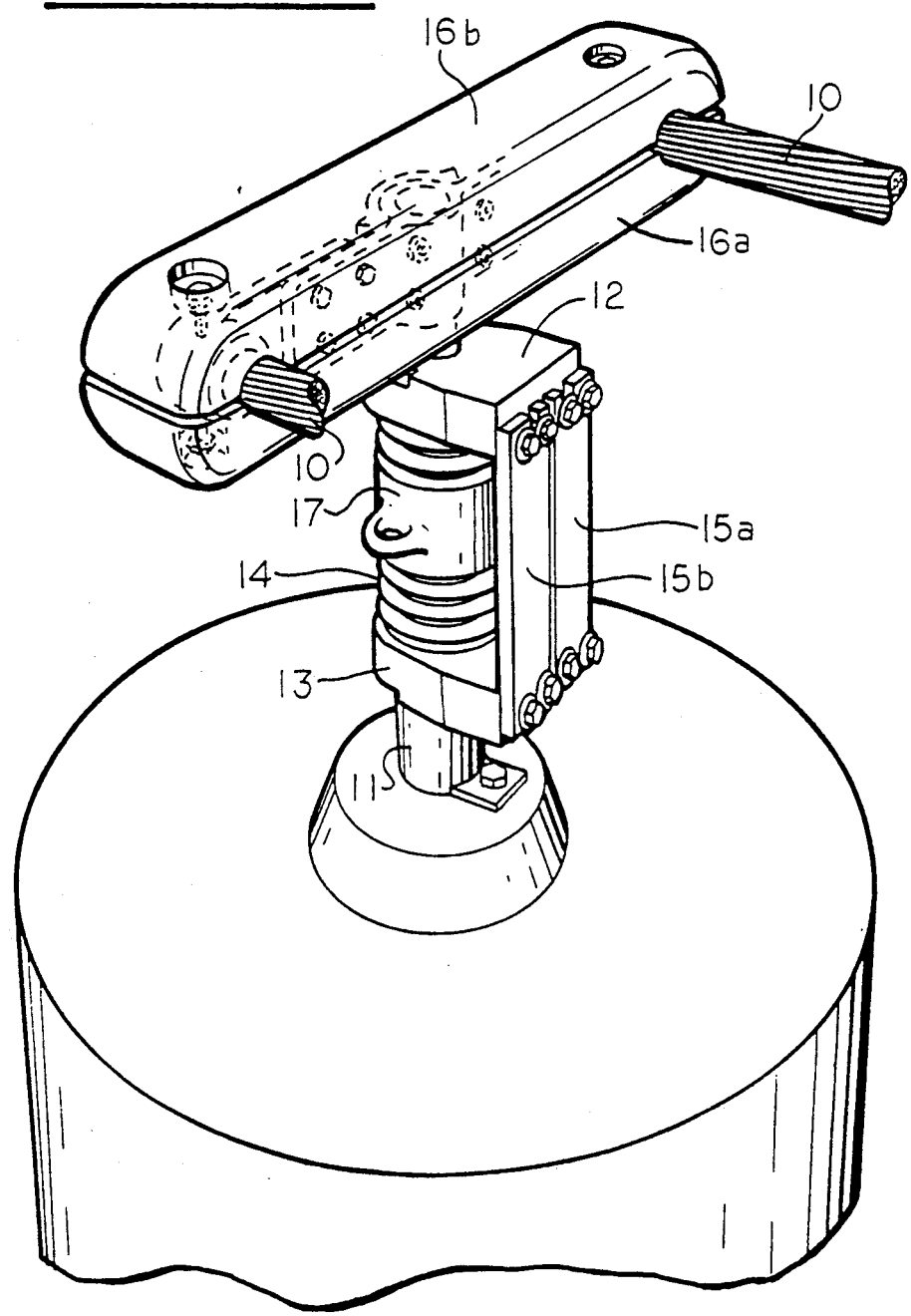
FIG. 1 is a perspective view of the prior art Lapp terminal, with portions in dotted outline, mounted on the top of a transformer bushing stud.

Referring to the prior art in general and the so-called Lapp terminal in particular, such as shown in FIG. 1, the terminal, which has been used in the industry for many years, utilizes a relatively lengthy vertical moment arm for connecting the ends of a pair of parallel heavy power cables or electrical lines 10 to the transformer stud such elements being located at right angles to each other. In combination with a pair of end fittings 12 and 13, a ceramic post type insulator 14, which is mounted upright, is subjected to severe mechanical stresses when the lines are ice coated or required to withstand high winds in stormy conditions. The end fittings 12 and 13 to which the ceramic insulator 14 is connected must be extremely durable and are dependent upon a pair of upright bus bars 15a and 15b connecting such fittings, to provide additional mechanical strength. In some cases the insulator is strengthened by a metallic band member 17 attached to a medial area of the insulator out of electrical contact with the fittings. A pair of generally similar connector plates 16a and 16b is connected to the cable ends which are aligned in spaced-apart relation, the lower plate 16a being joined to the upright stud portion of the upper fitting 12.

The ceramic insulator may be cracked when subjected to either severe mechanical and thermal stresses, the insulator being normally mounted in vertical relation causing it to be periodically subjected to severe torsional and tensile stresses The end fittings 12 and 13, utilizing U-bolt type connections, may cause the insulator ends to separate from the metallic fittings or, wherein they possess the lengthy upright moment arm, in some cases cause the transformer stud 11 to be bent to an angular position which can adversely affect transformer performance. Breakage of the heavy duty insulator component 14 of the terminal or angular distortion of the supporting stud 11 have caused increased maintenance of extra-high-voltage power lines and their electrical components, which has increased operational downtime and line servicing.

Figure 2:
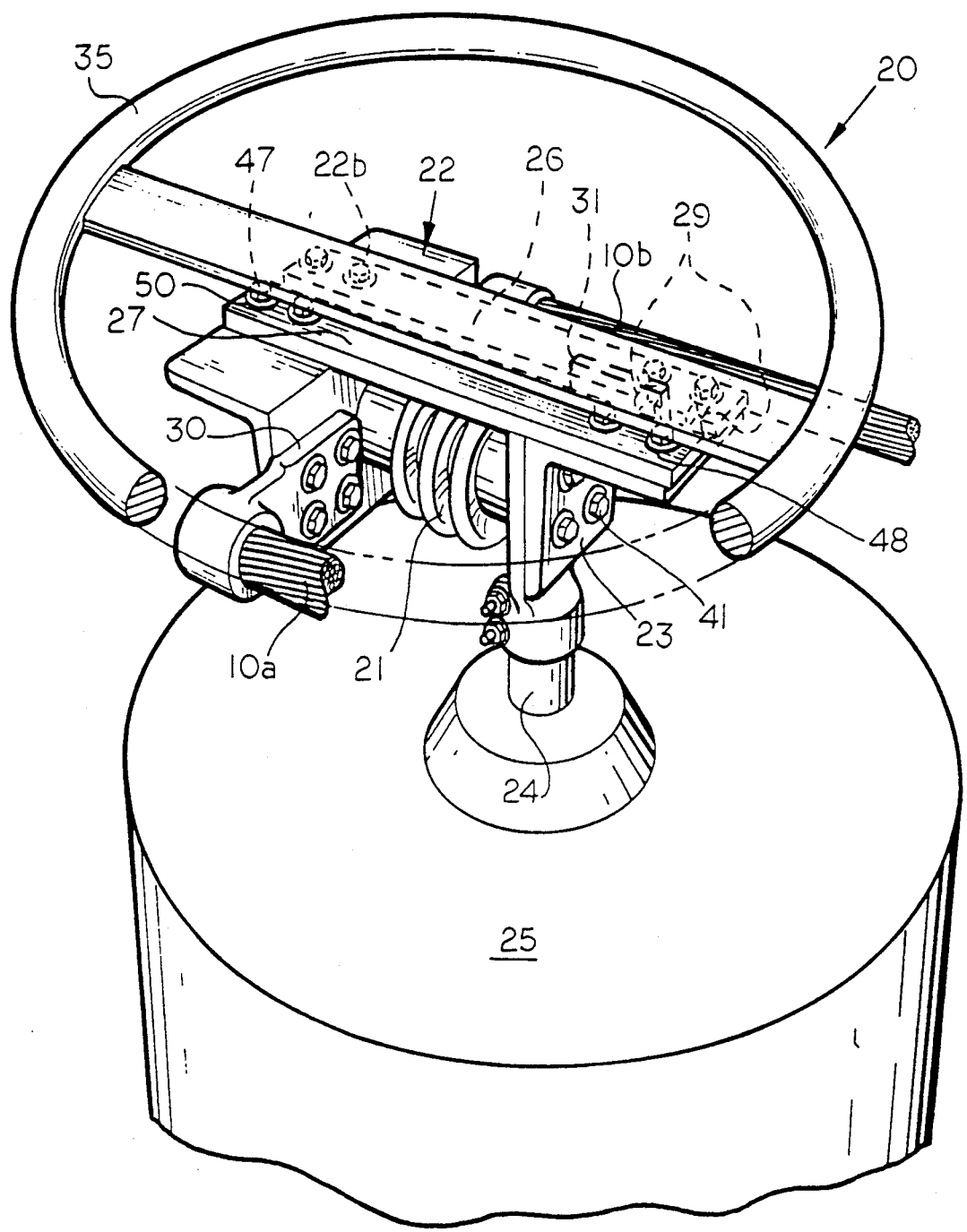
FIG. 2 is a perspective view of the subject test terminal mounted on top of a transformer bushing stud with a corona ring in place.
Figure 6:
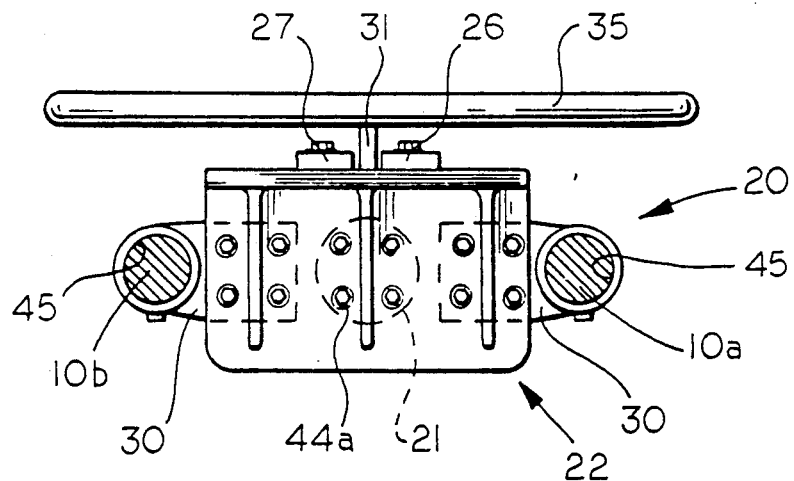
FIG. 6 is a vertical sectional view taken along the line 6—6 of FIG. 3.

FIG. 2 illustrates the improved test terminal 20 of the present invention having a substantially shortened vertical moment arm which is significantly more capable of withstanding adverse weather conditions and increased mechanical loading. The insulator component 21 of the terminal is mounted horizontally substantially in parallel relation with the ends of the pair of incoming power lines 10a and 10b. The insulator is preferably mounted immediately below the ends of such lines and intermediate thereof, substantially in the same horizontal plane. End fittings indicated generally at 22 and 23, are each formed of right-angled structural members, or may be additionally strengthened by added right-angle members, to provide their juxtaposed and the co-planar upper surfaces 22b and 23b for bus bar connection. Fitting 22 (FIG. 6) has a pair of exteriorly-projecting end plates 30 attached thereto to which the cable ends are connected. The metallic end fittings 22 and 23 are right-angled components having the essentially horizontal and vertical surfaces, the latter for mounting the insulator 21 in compression therebetween. Such compression is obtained by the outward interconnection of the power lines to end fitting 22 beyond the insulator 21 on one side and the upright supporting base plate 23 of the terminal which is connected to the bushing stud 24 of the transformer 25 on the other side. The conductive stud 24 extends upwardly through a bushing in a central region of the transformer 25, normally projecting upwardly for electrical interconnection to the power lines. The terminal is fully capable of electrically withstanding extremely high voltages such as those rated at 345 to 745 kilovolts, and the like, its mechanical strength being greatly increased due to the following arrangement of the terminal components.

Figure 4:
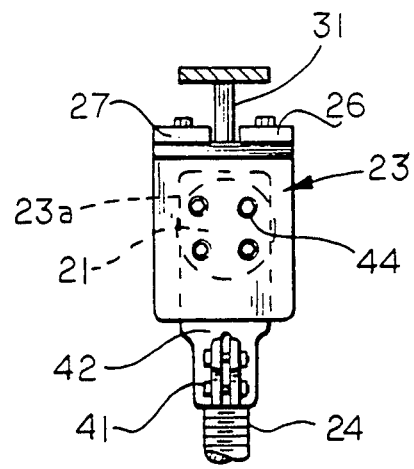
FIG. 4 is a vertical sectional view of the subject test terminal taken along the line 4—4 of FIG. 3.

The base plate 23 (FIGS. 4 and 5) has an aperture 40 at its lower end for connection to the bushing stud 24 of the transformer, such connection being made either by welding or by connection bolts 41 which are capable of tightening the base plate aperture having a U-shaped connector 42 on the stud in permanently affixed relation. The base plate has upwardly-extending vertical surface 23a capable of receiving one end of the insulator. The insulator 21 preferably may be a post-type high-density porcelain ceramic insulator of high dielectric constant having mounting recesses at its ends into which stud bolts 44 are placed extending from the base plate into the insulator. The base plate 23 is normally comprised of metal such as steel and has upper horizontally-extending flat surface 23b adapted to receive a pair of bus bars 26 and 27. Base plate 23 is either formed having right-angled surfaces, or is strengthened by a separate right-angled member, to provide both vertical and horizontal surfaces 23a and 23b for insulator and bus bar supporting surfaces respectively.

The other end fitting of the insulator comprises a cable-supporting plate 22 (FIGS. 5 and 6) also having vertical surface 22a to receive the other side of the insulator such as by stud bolts 44a extending into threaded recesses in the opposite end of the insulator. As desired or necessary, insulating cement may also be employed to retain the insulator ends along with the stud bolts. The cable-supporting plate 22 has the pair of outwardly extending members 30, each having an aperture 45 therein adapted to receive the ends of the heavy electrical cables 10a and 10b which are connected thereto. If desired, the apertures may be surrounded by U-bolt into which the cable ends are introduced and then tightened into permanent connection. The connections of the cables 10a and 10b to the cable-supporting plate 22 extend outwardly and beyond the vertical plan of the insulator 21 in parallel relation thereto, the insulator preferably being mounted in an intermediate area between the cable ends extending in the direction of the cable length. Having the cable connections secured beyond the vertical plane of the insulator end permits the cable-supporting plate 22 to exert compression on the insulator, the insulator being especially strong in compression and less capable of withstanding torsional and tensile stresses.

Figure 3:
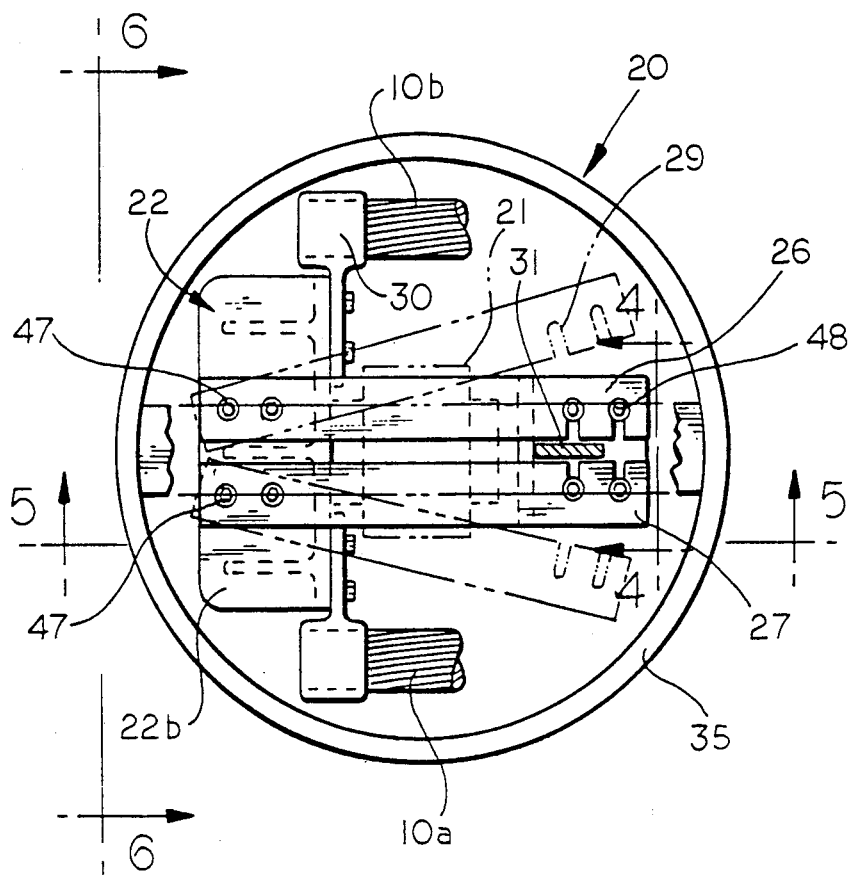
FIG. 3 is a top plan view of the subject test terminal with its pair of bus bars swung away in dotted outline, the bars being slotted to permit swinging disconnect.
Figure 5:
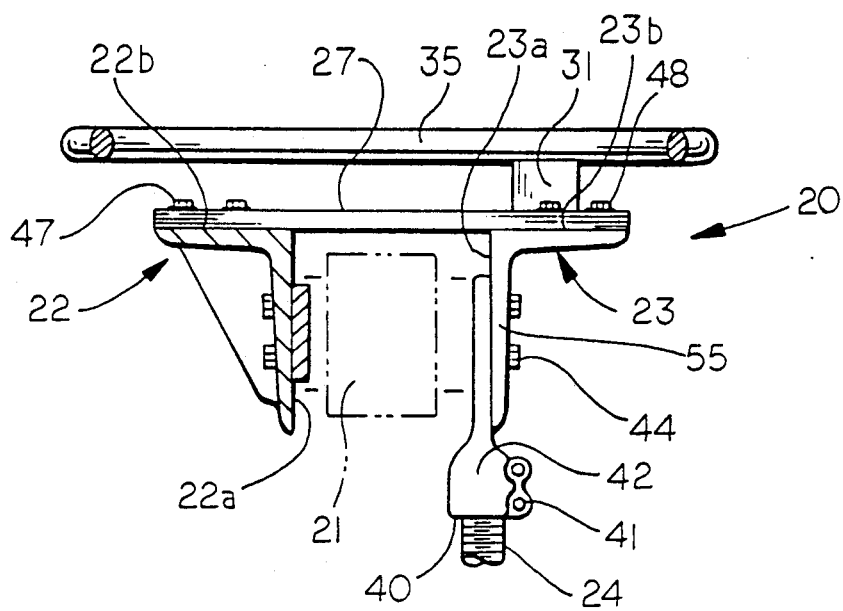
FIG. 5 is a vertical sectional view of the subject test terminal taken along the line 5—5 of FIG. 3.

Both the base plate 23 and cable-carrying plate 22 have horizontal upper surfaces 23b and 22b extending substantially in the same plane to receive the pair of metallic bus bars 26 and 27 having their ends connected to each of the aforesaid metal fittings 22 and 23 by pairs of bolts 47 and 48, respectively (FIGS. 2 and 3). The bars at both ends have pairs of bolt-receiving apertures 29 and 50 which permit their interconnection to the upper surfaces of base and cable-supporting plates, respectively. Apertures 29 are slots which are formed in at least one adjacent end of the two bars extending from their edges, into the bolt-hole apertures so that the retention bolts 47 and 48 for the bars at both ends may be simply loosened and the bars swung away horizontally to disconnect the terminal from electrical connection between the transformer and oncoming power cables. One of the bolts 47 is fully removed from the adjacent end of each of the two bars, the other bolt 47 being simply loosened to provide a pivot point for swinging the bars out of electrical contact. The end fitting 23 may be comprised of two component parts as shown in FIG. 5, one part 42 having the aperture 40 for connection to stud 24 and the attached second part 55 providing the bus bar supporting horizontal surface 23b.

When the two bars 26 and 27 are swung out of engagement of the plates into electrical disconnection, as shown in FIG. 3, the electrical testing of the various components and the lines may be conducted, for example, by determining induced electrical currents such as by Doble testing and other procedures. The two bars may be readily reconnected by replacing the two removed bolts 47 and retightening all of the bolts.

A circular corona-effect ring 35 is mounted above the terminal in horizontal relation and in vertical alignment with its central portion. The ring is supported by a plurality of three support members which are connected to the base and cable-supporting plates at spaced-apart locations such as at 120° intervals. One such support member is illustrated at 31. The corona ring 35 may not be required in some applications of the terminal and is optional for some use, say at 345 kilovolt transmission; however, it may be required in some installations for extra-high-voltage lines such as 745 kilovolt transmission.

Accordingly, the improved electrical terminal of this invention is simplified, provides an effective, safe, inexpensive, and efficient device which achieves all the enumerated objectives, provides for eliminating difficulties encountered with prior art devices such as insulator breakage, and solves problems and obtains new results in the art.

In the foregoing description, certain terms have been used for brevity, clearness and understanding; but no unnecessary limitations are to be implied therefrom beyond the requirement of the prior art, because such terms are used for descriptive purposes and are intended to be broadly construed.

Moreover, the description and illustration of the invention is by way of example, and the scope of the invention is not limited to the exact details shown or described.

Having now described the features, discoveries and principles of the invention, the manner in which the improved test terminal is constructed and used, the characteristics of the construction, and the advantageous, new and useful results obtained; the new and useful structure, devices, elements, arrangements, parts and combinations, are set forth in the appended claims.

I claim:

1. In combination, an electrical apparatus having an upright bushing stud to a pair of substantially horizontally extending electrical cables, and a high-voltage electrical test terminal connecting the pair of electrical cables to the upright bushing stud, said test terminal comprising an upright base plate having an aperture and clamping means connecting said base plate to said bushing stud of said electrical apparatus, a cable-supporting plate having a pair of horizontal apertures and clamping means retaining said pair of electrical cables at their ends in horizontal relation, an electrical insulator member mounted in horizontal relation between said base plate and said cable-supporting plate, a pair of conductive bus bars mounted in spaced-apart parallel relation joining said base plate to said cable-supporting plate, and disengagement means for disconnecting said bus bars from electrical contact between said base plate and said cable-supporting plate.

2. The combination in accordance with claim 1, wherein said insulating member is retained in compression between said base plate and said cable-supporting plate.

3. The combination in accordance with claim 1, wherein each of said bus bars is slotted at one end to facilitate ready disconnect of electrical contact between said base plate and said cable-supporting plate by pivotal swinging movement of said bus bars.

4. The combination in accordance with claim 1, wherein said bus bars are mounted in parallel relation with each other and above said insulator member for ready disconnect and reconnect of electrical current flow through said test terminal.

5. The combination in accordance with claim 1, including a circular corona-effect ring member mounted above said bus bars.

6. The combination in accordance with claim 1, wherein said disengagement means for said bus bars comprises a series of bolt hole apertures in each of said bus bars and complemental retention bolts for interconnection of said base plate and said cable-supporting plate, said apertures having interconnecting slots for pivotal horizontal movement of said bus bars on electrical disconnect 7. The combination in accordance with claim 1, wherein said test terminal has a short vertical moment arm minimize bushing stud damage due to mechanical overloading.

8. The combination in accordance with claim 1, wherein said insulator member is a porcelain insulator having a high dielectric constant which is retained in compression horizontally between juxtaposed vertical surfaces of said base plate and said cable-supporting plate.

9. The combination in accordance with claim 1, wherein said base plate and said cable-supporting plate have juxtaposed relatively smooth vertical surfaces for retention of said insulator member in compression in horizontal relation therebetween.

10. The combination in accordance with claim 1, wherein said aperture and clamping means on said upright base plate are located at a lower region of said base plate.

11. The combination in accordance with claim 1, wherein said pair of horizontal apertures and clamping means of said cable-supporting plate are spaced apart a substantial distance at horizontal extremities of said cable-supporting plate.

12. In combination, an electrical apparatus having an upright bushing stud, a pair of substantially horizontally extending electrical cables, and a high-voltage electrical test terminal connecting the pair of electrical cables to the upright bushing stud, said test terminal comprising an upright base plate connected to said upright bushing stud of said electrical apparatus, a cable-supporting plate located in horizontal spaced relationship from the base plate and retaining the pair of electrical cables at their ends in horizontal spaced relation, an insulator member mounted in compressed horizontal relation between said base plate and said cable-supporting plate in general alignment with said cable ends, conductive bus bar means for conducting electrical current extending between said base plate and said cable-supporting plate, and disengagement means for disconnecting said bus bar means from electrical contact between said base plate and said cable-supporting plate.

13. The combination in accordance with claim 12, wherein said test terminal is capable of withstanding 345 kilovolts and above, and said bus bar means is capable of ready disconnect for Doble testing of induced electrical currents.

14. The combination in accordance with claim 12, wherein said test terminal has a short vertical moment arm to minimize mechanical overloading of said electrical apparatus.

15. The combination in accordance with claim 12, wherein the total weight of said test terminal and said electrical cable ends is supported by said upright bushing stud of said electrical apparatus.

16. The combination in accordance with claim 12, wherein said insulator member comprises a post insulator mechanically joining said base plate and said cable-supporting plate in electrically insulated relationship from one another.

17. The combination in accordance with claim 12, wherein said base plate and said cable-supporting plate are comprised of metal fittings and said insulator member is comprised of high-density ceramic material.

18. The combination in accordance with claim 12, wherein said base plate and said cable-supporting plate both have flat upper horizontal surfaces for interconnection of said plates by said bus bar means mounted in horizontal relation above said insulator member.

19. The combination in accordance with claim 12, including a corona ring mounted above said test terminal and supported by said base plate and said cable-supporting plate to prevent corona discharges.

20. The combination in accordance with claim 12, wherein said pair of cable ends and said insulator member are mounted in substantially the same horizontal plane, said insulator member being mounted between said pair of cable ends.

* * * * *